United States Patent [19]

Erlich

[11] Patent Number: 5,111,163

[45] Date of Patent: May 5, 1992

[54] DIGITAL FM MODULATOR

[75] Inventor: Simha Erlich, Haifa, Israel

[73] Assignee: Hughes Aircraft Company, Los Angeles, Calif.

[21] Appl. No.: 695,839

[22] Filed: May 6, 1991

[51] Int. Cl.$^5$ .............................................. H03C 3/40
[52] U.S. Cl. .................................. 332/117; 332/120; 375/44; 455/42; 455/110
[58] Field of Search ..................... 332/117, 119–122, 332/100–105; 455/42, 110; 375/44, 45, 62, 67

[56] References Cited

U.S. PATENT DOCUMENTS 4,540,958  9/1985  Neyens et al. ................... 455/42 X
4,990,867  2/1991  Ogura et al. ........................ 332/102

Primary Examiner—Siegfried H. Grimm
Attorney, Agent, or Firm—Steven M. Mitchell; Gordon R. Lindeen, III; Wanda K. Denson-Low

[57] ABSTRACT

A digital FM modulator (10) which functions to modulate a fixed frequency, e.g. RF, reference signal $f_r$ with an incoming AM analog signal v(t) by way of utilization of digital signal processing circuitry (14, 18, 22, 26, 28, 38, 48). The digital FM modulator 10 includes a digital encoder, e.g. a codec 14, which samples the incoming analog signal v(t) at a prescribed sampling rate $f_s$, and converts it into a digital signal $S_D$ comprised of successive digital words representative of a prescribed parameter (e.g. amplitude) of the analog signal v(t) at corresponding, successive sampling times $t_i$. This digital signal $S_D$ is a digital data stream which is subsequently conditioned for input to a direct, digital synthesizer (DDS) (48), which, in response to this input, synthesizes an output signal having $I_A$ and $Q_A$ components disposed in phase quadrature relation to each other. The DDS output signal components $I_A$ and $Q_A$ are coupled to respective first and second mixers (62, 68) of an I/Q hybrid circuit (59), with the $I_A$ and $Q_A$ DDS output signal components serving to modulate the reference RF carrier signal $f_r$, which is also coupled to the mixers (62, 68) in phase quadrature, to thereby ultimately produce, after summation of the resultant $IF_A$ and $IF_B$ mixer output signals, a modulated FM signal P(t). The modulated FM signal P(t) is essentially equivalent to a modulated FM signal generated by an analog FM modulator, wherein the incoming analog signal v(t) modulates a voltage controlled oscillator (VCO).

20 Claims, 1 Drawing Sheet

DIGITAL FM MODULATOR

FIELD OF THE INVENTION

The present invention relates generally to FM modulators, and more particularly, to an essentially digital FM modulator, which has particular utility in cellular radiotelephones, for example.

BACKGROUND OF THE INVENTION

Presently available FM modulators are embodied in essentially analog hardware, including either a VCO or a VCXO.

A significant problem with the VCO-implemented FM modulators is frequency instability due, at least in part, to sensitivity to drifts and/or inaccuracies in operating voltage and manufacturing tolerances. A further problem with VCO-implemented FM modulators is the presence of noise in the FM output signal thereof, which critically limits the accuracy and resolution thereof.

The utilization of a VCXO in place of a VCO minimizes the above-noted problems experienced with VCO-implemented FM modulators, but not without the serious drawback of additional hardware requirements.

Due to greatly increased traffic handling capability requirements, digital cellular radiotelephone systems are currently being developed to supplement the existing analog cellular radiotelephone systems. However, in order to accommodate communications between the soon-to-be installed digital components and the already installed analog components of the resultant hybrid cellular infrastructure, it will be necessary for the individual mobile subscriber units (i.e. the hand-held and auto-installed cellular telephone sets) to have the versatility to interface with base stations operating in either the digital or the analog domain. These so-called dual-mode subscriber units must therefore have the capability to FM modulate (and discriminate) voice/data signals in either domain.

Since the dual-mode subscriber units are consumer items, cost, performance and size are highly sensitive parameters with regard to the marketing thereof. Currently available analog FM modulators, as discussed above, suffer from significant shortcomings and disadvantages which limit their utility in dual-mode subscriber units, since the utilization of these currently available analog FM modulators in this application would result in degraded performance and/or increased cost and size of the dual-mode subscriber units, relative to dual-mode subscriber units which utilize the essentially digital FM modulator of the present invention, which overcomes the limitations and drawbacks of these currently available analog FM modulators, for reasons which will become apparent in the ensuing brief and detailed descriptions of the present invention.

SUMMARY OF THE INVENTION

The present invention encompasses a digital FM modulator which functions to modulate a fixed frequency reference signal $f_r$ (e.g., an RF carrier signal), with an incoming analog signal $v(t)$, e.g. a voice/speech signal, by way of utilization of digital signal processing circuitry.

More particularly, the digital FM modulator includes a digital encoder, e.g. a codec, which samples the incoming analog signal $v(t)$ at a prescribed sampling rate $f_sm$ e.g. 48 kHz, and converts it into a digital signal $S_D$ comprised of successive digital words representative of a prescribed parameter (e.g. amplitude/voltage level) of the analog signal $v(t)$ at corresponding, successive sampling times $t_i$. This digital signal $S_D$ is preferably a digital data stream which is subsequently processed by digital signal processing circuitry for input to a direct, digital synthesizer (DDS).

In the presently contemplated best mode of the present invention, the digital signal processing circuitry preferably includes an integrator circuit to integrate the digital signal $S_D$, and a weighing circuit, e.g. a multiplier circuit, to weight the integrated digital signal $M(t_i)$ by a constant K, which is preferably $2\pi\Delta f/V_m$, where $\Delta f$ is the prescribed maximum frequency deviation of the modulator output signal $P(t)$, and $V_m$ is the peak amplitude/voltage value of the incoming analog signal $v(t)$. The output signal from the multiplier circuit $(MK)_i$ is preferably split into separate first and second signal components $(MK)_{ia}$ and $(MK)_{ib}$, which are identical to each other and to the multiplier output signal $(MK)_i$. The first signal component $(MK)_{ia}$ is phase-shifted by $\pi/2$ relative to the second signal component $(MK)_{ib}$, to thereby put these signal components in phase quadrature relation with respect to each other. The digital signal processing circuitry also preferably includes a real-to-integer converter for converting the values of these separate signal components $(MK)(MK)_{ia,ib}$ from real to integer terms $Int(MK)_{ia,ib}$, respectively. The integer values of the first and second signal components $Int(MK)_{ia,ib}$ are coupled to respective first and second inputs of a ROM of the DDS. The ROM stores a look-up table consisting of precomputed values of $sin(MK)_i$ for a multiplicity of possible $(MK)_i$ inputs thereto, over a full four-quadrant $(2\pi)$ range. The addresses of the $sin(MK)_i$ values are preferably the corresponding integer values $Int(MK)_{ia,ib}$, to thereby facilitate easy look-up. Thus, for every $Int(MK)_i$ (either ia or ib) input, the $sin(MK)_i$ value corresponding thereto is read out of the ROM 46, to thereby generate a digitized sinewave output signal comprised of phase quadrature components $I_D$ and $Q_D$, which are then converted by a digital-to-analog converter (DAC) into corresponding analog sinewave, phase quadrature components $I_A$ and $Q_A$, which together comprise the output signal from the DDS.

The DDS output signal components $I_A$ and $Q_A$ are coupled to respective first and second mixers of an I/Q hybrid circuit, with the $I_A$ and $Q_A$ DDS output signal components serving to modulate the reference RF carrier signal $f_r$, which is also coupled to the first and second mixers, in phase quadrature, to thereby ultimately produce, after summation of the resultant $IF_A$ and $IF_B$ mixer output signals, a modulated FM signal $P(t)$. The modulated FM signal $P(t)$ is essentially equivalent to a modulated FM signal generated by an analog FM modulator, wherein the incoming analog signal $v(t)$ modulates a voltage controlled oscillator (VCO).

A presently contemplated significantly advantageous application of the above-described digital FM modulator of the present invention is in dual-mode cellular radiotelephone subscriber units. More particularly, this utilization of the digital FM modulator facilitates implementation of the FM modulation and FM discrimination functions of an analog cellular radiotelephone using essentially the same hardware that will be required to handle the digital signal transmissions for the soon-to-be-installed digital cellular systems, thereby reducing the hardware/firmware requirements for dual-mode cellular radiotelephone subscriber units, resulting in more easily manufacturable, more compact, and less expensive dual-mode subscriber units than would otherwise be possible using currently available analog FM modulators. Further, the digital FM modulator of the present invention is easily programmable for simple and accurate control of sensitive FM modulation parameters such as modulation index and maximum frequency deviation.

Many other features, aspects, and advantages of the present invention will become apparent from the following detailed description of the invention taken in conjunction with the accompanying drawings, in which:

DETAILED DESCRIPTION OF THE INVENTION

Figure 1:
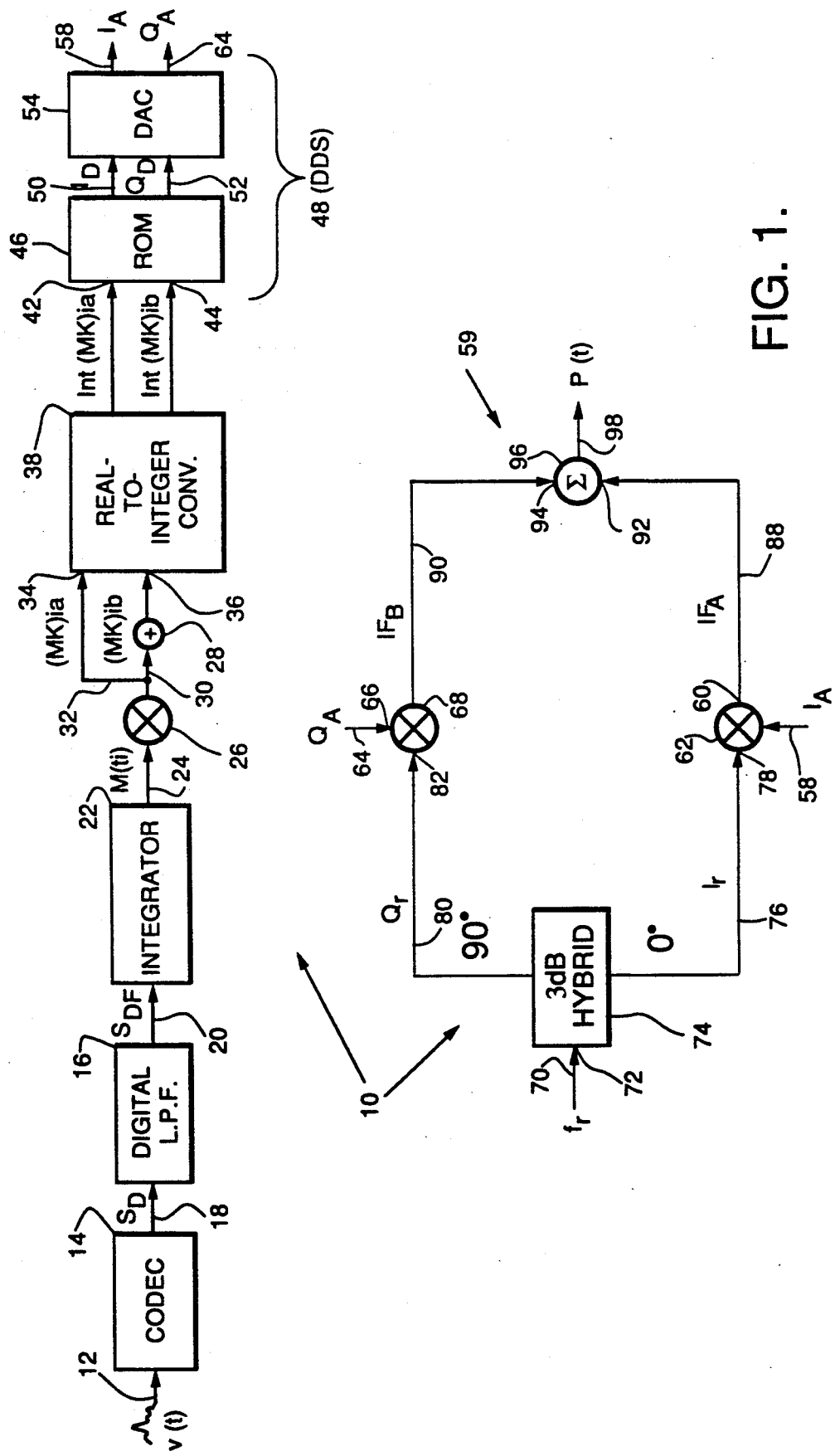
FIG. 1 is a functional block diagram of the presently contemplated best mode of the digital FM modulator of the present invention.

Referring now to FIG. 1, there can be seen a functional block diagram of a digital FM modulator 10 incorporating fundamental principles of the present invention and constituting a preferred embodiment thereof. As can be seen, an analog input signal designated v(t) is applied over line 12 to the input of a digital encoder/decoder or codec 14. The analog input signal v(t) is a signal having a voltage level (v) which varies as a function of time (t), e.g., an AM audio or voice signal. In the presently contemplated application of the present invention, the input signal is a voice or speech signal within the framework of a cellular radiotelephone system. The input signal v(t) is sampled by the codec 14 at a suitable sampling rate $f_s$, e.g., 8 kH$_z$. The specific sampling rate $f_s$ chosen will depend, in large measure, upon the degree of resolution required for a given application, as is well-known to those skilled in the pertinent art. The output signal $S_D$ from the codec 14 is a digital representation of the analog input signal v(t), and is comprised of a succession of discrete digital words representative of the voltage value of the sampled analog input signal v(t) at corresponding discrete sampling times. Further, depending upon the given application, it may be necessary to interpolate the codec output signal $S_D$ in order to expand the effective rate at which the analog input signal v(t) is sampled. For example, the minimum sampling rate for speech/voice signals in many applications is generally considered to be 48 kH$_z$, in order to facilitate adequate reconstruction of the speech/voice signal upon re-conversion of the digital signal representative thereof (i.e. $S_D$) back to its original analog form. In this instance, the codec output signal $S_D$ must be interpolated by a factor of 6:1, meaning that five consecutive "zero bits" must be added to each digital word representing a discrete sample of the input voice/speech signal v(t), to thereby expand the sampling rate $f_s$ by a factor of 6.

Referring still to FIG. 1, this interpolation function is effectuated by a digital low-pass filter (LPF) 16 which receives the codec output signal $S_D$ over line 18, at its input and which outputs over line 20, a digital modulation input signal $S_{DF}$ which is a filtered version of the codec output signal $S_D$ and is representative of the analog input signal v(t) sampled at an effective sampling rate $f_{SE}$ equal to the interpolation factor F multiplied by the codec sampling rate $f_s$, i.e., $f_{se}=f_s \times F$. Thus, in the above-given example, where $f_s=8$ kH$_z$ and $F=6$, $f_{se}=8\times 6=48$ kH$_z$.

With continuing reference to FIG. 1, the digital FM modulator 10 of the instant invention further includes an integrator circuit 22 for performing a numerical integration of the digital modulator input signal $S_{DF}$, i.e., (1) $M(t_i)=\Sigma_i S_{DFi}$, where i represents each discrete sampling time $t_i$; $S_{DFi}$ represents the particular digital word corresponding to the sampled value of the input signal v(t) at each discrete sampling time, $t_i$; and, $M(t_i)$ is the output of the integration circuit 22, at each discrete sampling time $t_i$. It should be appreciated that $\Sigma_i S_{DFi}$ is essentially equivalent to $\int v(t)dt$.

The output signal $M(t_i)$ of the integrator circuit 22 is coupled over line 24 to the input of a multiplier circuit 26, which functions to multiply the output signal $M(t_i)$ by a multiplier constant K, the value of which is chosen on the basis of the requirements of a given application. For example, in the context of a voice/speech signal processing application, a convenient constraint on the transmitted signal is that its envelope be constant, i.e., that its peak-to-peak amplitude/voltage be held constant. As will be fully developed hereinafter, this constraint can be effected by setting the value of the multiplier constant K in accordance with the following equation (2):

$$K=2\pi \Delta f/V_m \qquad (2)$$

where $\Delta f$ is the prescribed maximum frequency deviation of the modulator output signal P(t), and $V_m$ is the peak amplitude/voltage value of the analog input signal v(t). It should be appreciated that a divider circuit (not shown) can be employed in lieu of the multiplier circuit 26, in which case the divisor would be the inverse of the constant K, i.e. 1/K. Moreover, any other suitable type of weighting circuit may be utilized in lieu of either the multiplier circuit 26 or the divider circuit.

The output signal $(MK)_i$ from the multiplier circuit 26 is split into two separate signal components $(MK)_{ia}$ and $(MK)_{ib}$, which are identical to each other and to the multiplier output signal $(MK)_i$. The first signal component $(MK)_{ia}$ is delayed or phase-shifted by $\pi/2$ relative to the second signal component $(MK)_{ib}$, by any suitable time delay or phase shifter device 28, e.g., a digital summer, which adds $\pi/2$ to the second signal component. In essence, the two digital signal components $(MK)_{ia}$ and $(MK)_{ib}$ are in phase quadrature with each other.

The first signal component $(MK)_{ia}$ is applied over line 32 to a first input 34 of a real-to-integer converter 38, and the second signal component $(MK)_{ib}$ is applied over line 30 to a second input 36 of the real-to-integer converter 38. The real-to-integer converter 38 functions to convert the values of the first and second signal components from real to integer values, in accordance with a conversion formula determined on the basis of the degree of resolution required for a given application, as will be brought out hereinafter.

The integer values Int $(MK)_{ia}$ and Int $(MK)_{ib}$ of the first and second signal components, respectively, are coupled to first and second inputs 42, 44 respectively, of a ROM 46 of a direct digital synthesizer (DDS) 48. The design, architecture and operation of DDS's are well-known to those skilled in the art, and, in this regard, reference is hereby made to U.S. Pat. Nos. 3,984,771; 4,134,076; 4,633,183; 4,652,832; and, 4,901,265.

The ROM 46 stores a look-up table consisting of precomputed values of sin $(MK)_i$ for a multiplicity of possible $(MK)_i$ inputs thereto, over a full fourquadrant ($2\pi$) range. The addresses of the sin$(MK)_i$ values are the corresponding Int $(MK)_i$ input values, to thereby facilitate easy look-up. Thus, for every Int $(MK)_i$ (either ia or ib) input, the sin $(MK)_i$ value corresponding thereto is read out of the ROM 46, to thereby generate a digitized sinewave output signal comprised of phase quadrature components $I_D$ and $Q_D$, wherein the $I_D$ component comprises a digitized sinewave corresponding to the sine function transformation of the Int $(MK)_{ia}$ values applied to the input 42 of the ROM 46, and the $Q_D$ component comprises a digitized sinewave corresponding to the sine function transformation of the Int$(MK)_{ib}$ values coupled to the input 44 of the ROM 46. It should be recognized that since the Int $(MK)_{ia}$ and Int $(MK)_{ib}$ values are in phase quadrature relation, then the value of the corresponding $I_D$ output signal component is equal to sin $(MK)_i$, and the value of the corresponding $Q_D$ output signal component is equal to cos $(MK)_i$. The $I_D$ and $Q_D$ components of the output signal from the ROM 46 are carried over lines 50, 52 respectively, and applied to a digital-to-analog converter (DAC) 54, which functions to convert the digitized sine waves $I_D$ and $Q_D$ into analog sine waves $I_A$ and $Q_A$, respectively, which together constitute the output signal from the DDS 48. The instantaneous frequency $f_g$ of the DDS output signal is governed by the phase difference between two successive $(MK)_i$ values and the rate, $f_s$, at which the ROM addresses are cycled through, in accordance with the following equation (3):

$$f_g = [(MK)_i - (MK)_{i-1}] f_s / 2\pi \quad (3)$$

In this regard, it should be clearly understood that the $(MK)_{ia}$ and $(MK)_{ib}$ components of each successive output signal $(MK)_i$ from the multiplier circuit 26 are considered to be a single $(MK)_i$ value for purposes of determining the DDS output signal frequency $f_g$ in accordance with equation (3) above, even though a separate sin value is read out of the ROM look-up table for each of the components $(MK)_{ia}$ and $(MK)_{ib}$, since the time difference between these two readings is very short relative to the sampling rate $f_s$, so that for all practical intents and purposes, these two readings are virtually "simultaneous".

As will be readily appreciated by those skilled in the pertinent art, the resolution of the DDS 48 is linearly proportional to the size of the ROM look-up table. For example, to achieve a resolution of 0.5 degree, the overall range $2\pi$ is divided by 720, thereby establishing an index range j of the ROM addresses of 0-719, inclusive. For each ROM address j, the corresponding precomputed, stored sine value is determined in accordance with the following equation (4):

$$j \rightarrow \sin (2\pi / 720 \times j) \quad (4)$$

Additionally, in order to implement the foregoing scheme, the real-to-integer converter 38 is preferably designed to convert the successive $(MK)_{ia}$ and $(MK)_{ib}$ values from real to integer values, in accordance with the following equation/conversion formula (5):

$$\text{Int}(MK)_{ia} = [(MK)_{ia}/2\pi \times 720 + 0.5], \text{ and,}$$
$$\text{Int}(MK)_{ib} = [(MK)_{ib}/2\pi \times 720 + 0.5] \quad (5)$$

Where $Tx$] is the greatest integer contained in x, e.g. [5.3] = 5.

In cases where $(MK)_{ia}$ or $(MK)_{ib}$ is negative (e.g., since speech/voice signals are randomly distributed with a zero average level, then for each $(MK)_i$ value, there is an approximately 50% probability that the level will be either negative or positive), the real-to-integer converter 38 performs a modulo operation to convert the final integer value to a number within the selected index range, e.g. j=0-720. For example, if the $(MK)_i$ integer value is $-20$, then this value is transformed by modulo operation to 200, i.e. 720-20=700.

After D/A conversion by the DAC 54, the $I_A$ and $Q_A$ components of the DDS output signal may be passed through an analog filter (not shown) to filter out any alias frequencies which may be present. The need to filter out alias frequencies can be mitigated by increasing the sampling frequency $f_S$, e.g., from 48 kHz to 64 kHz.

With continuing reference to FIG. 1, it can be seen that the $I_A$ component of the DDS output signal is applied over line 58 to a first input 60 of a first mixer 62 of an I/Q hybrid circuit 59, and that the $Q_A$ component of the DDS output signal is applied over line 64 to a first input 66 of a second mixer 68 of the I/Q hybrid circuit 59. Further, it can be seen that a reference carrier signal $f_r$, generated by a suitable fixed frequency (e.g., RF) signal source (not shown), e.g., a crystal oscillator, is applied over a line 70 to the input 72 of a directional or hybrid coupler 74, which functions to split the RF carrier signal $f_r$, into two phase quadrature components $I_r$ and $Q_r$, i.e. the $Q_r$ component phase leads or lags the $I_r$ component by 90°, the $I_r$ component being in-phase with the RF carrier signal $f_r$, and the $Q_r$ component being $\pm 90°$ out-of-phase with the RF carrier signal $f_r$. The $I_r$ component is applied over line 76 to second input 78 of the first mixer 62, and the $Q_r$ component is applied over line 80 to second input 82 of the second mixer 68. The first mixer 62 functions in the conventional manner to directly mix (e.g. add or subtract) the DDS output signal component $I_A$ with the RF carrier signal component $I_r$, to produce a first intermediate frequency (I.F.) output signal $IF_A$, and the second mixer 68 functions in the conventional manner to directly mix the DDS output signal component $Q_A$ with the RF carrier signal component $Q_r$ to produce a second intermediate frequency (I.F.) output signal $IF_B$. Thus, it can be appreciated that the DDS output signal components $I_A$ and $Q_A$ are the modulating signals, and the RF carrier signal components $I_r$ and $Q_r$ are the modulated signals. In this vein, the RF carrier signal $f_r$ can be considered a local oscillator (L.O.) signal which is heterodyned by the first and second mixers 62, 68 with the DDS output signal, which can be considered the modulating signal. Thence, the $IF_A$ and $IF_B$ mixer output signals are applied over lines 88, 90 to respective inputs 92, 94 of a power summer 96, which functions in the conventional manner to sum/combine the $IF_A$ and $IF_B$ signals and to output the thusly combined signal, P(t) over device output line 98. As can be readily appreciated, the device output signal P(t) constitutes a modulated FM signal. Of course, if the incoming analog modulating signal V(t) is a voice signal, the device output signal P(t) would constitute a voice-modulated FM signal.

A presently contemplated significantly advantageous application of the above-described digital FM modulator of the present invention is in dual-mode cellular radiotelephone subscriber units. More particularly, this utilization of a digital FM modulator designed in accordance with the principles of the present invention facilitates implementation of the FM modulation and FM discrimination functions of an analog cellular radiotelephone using the same hardware (e.g. the TMS family of digital signal processing devices) that will be required to handle the digital signal transmissions for the soon-to-be-installed digital cellular systems, thereby reducing the hardware/firmware requirements for dual-mode cellular radiotelephone subscriber units, resulting in easier-to-manufacture, more compact, and less expensive dual-mode subscriber units than would otherwise be possible using currently available analog FM modulators. Further, the digital FM modulator of the present invention is easy to program and facilitates simple and accurate control of sensitive FM modulation parameters such as modulation index and maximum frequency deviation.

The following is a brief explanation of the derivation of the mathematical basis for the architectural design and operation of the above-described preferred embodiment of the digital FM modulator 10 of the present invention.

Initially, in order to provide a framework for mathematical analysis of operational parameters, the basic theory of the design and operation of the digital FM modulator 10 must be clearly understood. In this regard, the above and foregoing detailed description of the design and operation of the digital FM modulator 10 can be summarized as follows. Namely, the incoming analog input signal v(t) is sampled by the codec 14 and converted thereby into a digital data stream which consists of successive digital words representative of the value of some parameter (e.g. amplitude) of the analog input signal v(t) at corresponding, successive sampling times, $t_i$. This digital data stream is subsequently manipulated and then processed by the DDS 48 to synthesize an output signal having $I_A$ and $Q_A$ phase quadrature components which are, in turn, coupled to respective mixers 62, 68 of the I/Q hybrid circuit 59 with the $I_A$ and $Q_A$ DDS output signal components serving to modulate the reference RF carrier signal $f_r$, which is also coupled to the mixers 62, 68, to thereby ultimately produce, after summation of the resultant IF signals, at the output of the hybrid I/Q circuit 59, a modulated FM signal P(t) equivalent to a modulated FM signal generated by an analog FM modulator, wherein the incoming analog signal v(t) modulates a voltage controlled oscillator (VCO).

Within the above-delineated framework, operational parameters can best be established by way of a mathematical analysis of the I/Q hybrid circuit 59. As a starting point, the reference RF carrier signal $f_r$ is arbitrarily selected to be the cosine function cos ($\omega_0 t$). With this parameter established, the I/Q hybrid circuit output signal P(t) can be mathematically represented by the following equation (6):

$$P(t) = \sqrt{I_A^2(t) + Q_A^2(t)} \cos(\omega_0 t + \tan^{-1}(Q_A(t)/I_A(t))). \quad (6)$$

In order for P(t) to represent a v(t)-modulated FM signal, the argument of the cosine function preferably behaves in accordance with the following equation (7):

$$\tan^{-1}(Q_A(t)/I_A(t)) = \Delta f/V_m \int v(t)dt, \quad (7)$$

where $\Delta f$ represents the maximum frequency deviation of the analog input signal v(t), and $V_m$ represents the peak amplitude/voltage value of the analog input signal v(t).

Equation (7) constitutes a first mathematical constraint for the I/Q hybrid circuit 59. However, in order to find $Q_A(t)$ and $I_A(t)$, a second constraint is required. This second constraint can be any constraint which is convenient for a given application, and thus, can be selected almost arbitrarily. For example, a convenient constraint for the presently contemplated cellular radiotelephone application of the present invention is the previously discussed constant envelope requirement for the P(t) output signal since, with FM signals, the information is contained in the phase, and not in the amplitude of the transmitted signal. This constraint can be represented mathematically by the following equation (8):

$$\sqrt{I_A^2(t) + Q_A^2(t)} = A, \quad (8)$$

where A is the selected constant peak-to-peak amplitude of the modulator output signal P(t).

From equation (8), the following equations (9) and (10) can be derived:

$$I_A(t) = A \cos (\Delta f/V_m \int v(t)dt), \text{ and} \quad (9)$$

$$Q_A(t) = -A \sin (\Delta f/V_m \int v(t)dt). \quad (10)$$

Thus, based upon the above mathematical analysis, it can be readily appreciated that the digital data stream representing the incoming analog signal v(t) must be processed in accordance with equations (9) and (10) above, in order to enable the hybrid I/Q circuit 59 to generate a properly modulated FM output signal P(t). As has been described in detail hereinabove, these equations (9) and (10) are implemented by the integrator circuit 22, the multiplier circuit 26, the phase shifter device 28, the real-to-integer converter 38, and the DDS 48, to thereby result in the production of DDS output signal components $I_A$ and $Q_A$ which essentially satisfy these equations (9) and (10).

Although the present invention has been described in detail hereinabove, it should be clearly understood that many variations and/or modifications of the basic inventive concepts herein taught which may appear to those skilled in the pertinent art will still fall within the spirit and scope of the present invention, which should be interpreted on the basis of the claims appended hereto.

What is claimed is:

1. A digital FM modulator, comprising:
digital converter means for converting an AM analog input signal into a digital signal representative thereof;
digital signal processing means for processing said digital signal;
digital synthesizer means responsive to said processed digital signal for generating first and second variable frequency synthesizer output signals, I1 and Q1, respectively, disposed in phase quadrature relation with each other;
signal generating means for generating a fixed frequency reference signal;
I/Q hybrid circuit means, including:
signal splitter means for splitting said reference signal into first and second reference signal components I2 and Q2, respectively, disposed in phase quadrature relation with each other;

first mixer means for mixing said first reference signal component I2 with said first synthesizer output signal I1, to thereby produce a first intermediate frequency output signal IF1;

second mixer means for mixing said second reference signal component Q2 with said second synthesizer output signal Q1, to thereby produce a second intermediate frequency output signal IF2;

summer means for combining said first intermediate frequency output signal IF1 and said second intermediate frequency output signal IF2, to thereby produce an FM modulator output signal.

2. The modulator as set forth in claim 1, wherein said digital signal processing means includes integrator means for integrating said digital signal, to thereby produce an integrated digital signal.

3. The modulator as set forth in claim 2, wherein said digital signal processing means further includes weighting means for weighting said integrated digital signal by a prescribed constant K, to thereby produce a weighted integrated digital signal MK.

4. The modulator as set forth in claim 3, wherein said prescribed constant is $2 \, df/V_m$, wherein df represents the prescribed maximum frequency deviation of said FM modulator and $V_m$ represents the peak amplitude of said AM analog input signal.

5. The modulator as set forth in claim 3, wherein said digital signal processing means further includes digital signal branching means for branching said weighted integrated digital signal MK into two separate signal flow paths, to thereby produce first and second digital signals MK1 and MK2 which are identical to each other and to said weighted integrated digital signal MK.

6. The modulator as set forth in claim 5, wherein said digital signal processing means further includes phase shifter means for shifting the phase of said first digital signal MK1 by $\pi/2$ relative to said second digital signal MK2.

7. The modulator as set forth in claim 6, wherein said digital converter means includes means for sampling the amplitude value of said AM analog input signal at a prescribed sampling rate Fs, and for generating successive digital words corresponding to the sampled values of said AM analog input signal at successive sampling times $t_i$, wherein said digital signal is comprised of said successive digital words.

8. The modulator as set forth in claim 7, wherein said digital synthesizer means comprises a direct digital synthesizer which includes:

a ROM device containing a look-up table comprised of a multiplicity of precomputed values for sin(MK) over a prescribed range of possible MK values, with said precomputed values sin(MK) being stored in said ROM device at memory locations whose addresses are corresponding ones of said possible MK values, and wherein said ROM device includes a first input means for receiving said first digital signal MK1 and a second input means for receiving said second digital signal MK2;

read-out means responsive to said first digital signal MK1 for reading out of said look-up table, at a read-out rate $F_r$ equal to said sampling rate $F_s$, successive sin(MK) values corresponding to the addresses whose values are equal to the successive values of said first digital signal MK1 at successive sampling times $t_i$, and responsive to said second digital signal MK2 for reading out of said look-up table, at said read-out rate $F_r$, successive sin(MK) values corresponding to the addresses whose values are equal to the successive values of said second digital signal MK2 at successive sampling times $t_i$;

first output means for outputting said read-out sin(MK) values corresponding to said successive first digital signal MK1 values, to thereby produce a first ROM output signal from said ROM device which is a digital version of said first synthesizer output signal I1;

second output means for outputting said read-out sin(MK) values corresponding to said successive second digital signal MK2 values, to thereby produce a second ROM output signal from said ROM device which is a digital version of said second synthesizer output signal Q1; and, digital-to-analog converter means for converting said first ROM output signal into said first variable frequency synthesizer output signal I1 and for converting said second ROM output signal into said second variable frequency synthesizer output signal Q2.

9. The modulator as set forth in claim 8, wherein said signal splitter means comprises a 3 dB hybrid coupler.

10. The modulator as set forth in claim 8, wherein said summer means comprises a power summer.

11. The modulator as set forth in claim 8, wherein said sampling rate $F_s$ is 48 kHz.

12. The modulator as set forth in claim 8, wherein said AM analog input signal is a voice signal, whereby said FM modulator output signal comprises a voice-modulated FM signal, and wherein further, said digital converter means comprises a codec.

13. The modulator as set forth in claim 8, wherein said weighting means comprises a multiplier circuit.

14. The modulator as set forth in claim 8, further comprising real-to-integer converter means for converting said first digital signal MK1 and said second digital signal MK2 from real values to integer values.

15. The modulator as set forth in claim 14, wherein said real-to-integer converter means is adapted to convert said first digital signal MK1 in accordance with the equation $Int(MK1_i) = (MK1_i/2) \times C$, wherein $MK1_i$ represents the value of said first digital signal MK1 at each successive sampling time $t_i$, and C represents a prescribed constant, and is further adapted to convert said first digital signal MK1 in accordance with the equation $Int(MK2_i) = (MK2_i/2) \times C$, wherein $MK2_i$ represents the value of said first digital signal MK2 at each successive sampling time $t_i$.

16. The modulator as set forth in claim 8, wherein said phase shifter means comprises a digital summer circuit.

17. The modulator as set forth in claim 15, further comprising filtering means for filtering said first synthesizer output signal I1 and said second synthesizer output signal Q1 to attenuate any alias frequencies which may be present therein.

18. The modulator as set forth in claim 15, wherein said fixed frequency reference signal comprises an RF signal.

19. The modulator as set forth in claim 15, wherein said signal generating means comprises a crystal oscillator.

20. The modulator as set forth in claim 15, wherein said AM analog input signal comprises a voice signal in a cellular radiotelephone system, and wherein further, said digital converter means comprises a digital encoder.

* * * * *